United States Patent
Mori et al.

(10) Patent No.: US 7,492,184 B2
(45) Date of Patent: Feb. 17, 2009

(54) PROGRAMMABLE LOGIC DEVICE AND METHOD FOR DESIGNING THE SAME

(75) Inventors: Atsuhiro Mori, Osaka (JP); Shinichi Marui, Osaka (JP); Minoru Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 10/581,024

(22) PCT Filed: Mar. 10, 2005

(86) PCT No.: PCT/JP2005/004221

§ 371 (c)(1),
(2), (4) Date: Apr. 12, 2007

(87) PCT Pub. No.: WO2005/091357

PCT Pub. Date: Sep. 29, 2005

(65) Prior Publication Data

US 2008/0042687 A1      Feb. 21, 2008

(30) Foreign Application Priority Data

Mar. 18, 2004    (JP)    ............... 2004-078826

(51) Int. Cl.
*H03K 19/173*    (2006.01)
(52) U.S. Cl. ............... 326/38; 326/39; 326/40; 716/16; 716/17
(58) Field of Classification Search ............. 326/38–41; 716/16–17
See application file for complete search history.

(56) References Cited

U.S. PATENT DOCUMENTS

| | | | |
|---|---|---|---|
| 6,944,836 B1 * | 9/2005 | Lai | ............... 716/4 |
| 2002/0100944 A1 | 8/2002 | Ishibashi et al. | |
| 2003/0016055 A1 | 1/2003 | Oodaira et al. | |
| 2004/0174187 A1 * | 9/2004 | New | ............... 326/41 |

FOREIGN PATENT DOCUMENTS

| | | |
|---|---|---|
| JP | 07-066373 | 3/1995 |
| JP | 07-161938 | 6/1995 |
| JP | 07-297291 | 11/1995 |
| JP | 2002-538634 | 11/2002 |
| WO | WO 00/52826 | 9/2000 |
| WO | WO 03/001591 A1 | 1/2003 |

* cited by examiner

*Primary Examiner*—Vibol Tan
(74) *Attorney, Agent, or Firm*—McDermott Will & Emery LLP

(57) ABSTRACT

The power consumption and area of a programmable logic device formed from programmable logical elements can be reduced.

In a programmable logic device 101 formed from programmable logical elements, there are provided first logical elements 102 and second logical elements 104 having the same logic as the first logical elements 102 but having an upper limit of operating speed designed to be lower than that of the first logical elements 102.

8 Claims, 4 Drawing Sheets

PROGRAMMABLE LOGIC DEVICE AND METHOD FOR DESIGNING THE SAME

TECHNICAL FIELD

The present invention relates to a programmable logic device including a plurality of programmable logical elements arranged in rows and columns, and a method for designing the same.

BACKGROUND ART

The life cycles of products tend to become shorter and shorter because needs for information processing in information processing terminals have been diversified so that standards for communication systems and signal processing have changed kaleidoscopically in recent years. Devices having functions capable of being changed by programs are useful to cope with the shortening of the life cycles of products. A DSP (Digital Signal Processor) and a microprocessor are examples of these devices. In the DSP or microprocessor, an instruction program can be changed to provide the degree of freedom of the program in the instruction level. The DSP or microprocessor is however inferior in processing performance to an ASIC (Application Specified IC) limited to a specific purpose of use.

Therefore, a programmable logic device having circuit configuration allowed to be changed flexibly by a program has attracted attention as a device having both processing performance of an ASIC and programmability of a microprocessor. Although there are several kinds of programmable logic devices, an FPGA (Field Programmable Gate Array) is representative of the programmable logic devices. Although these devices have a merit that the circuit configuration of each device can be changed by a program, these devices have a demerit in increase in area, increase in electric power consumption, etc., as compared with the ASIC.

On the other hand, as a method for reducing the area of a programmable logic device, for example, there is a method as follows (see Patent Document 1). In Patent Document 1, wiring resources for connecting logical elements on the programmable logic device are formed from two wiring resources, that is, a first resource having a communication speed called "normal speed" and a second resource having a communication speed higher than that of the first resource. As for the proportion of these two resources, the first resource accounts for a large part of the wiring resources and the second resource accounts for a small part thereof. Thus, when the second resource is used for only part of the wiring requiring high speed communication while the first resource is used for normal communication, all wirings need not be designed in accordance with a high speed so that increase in area caused by the high speed design can be suppressed.

Patent Document 1: International Patent Publication No. 2002-538634

DISCLOSURE OF THE INVENTION

The programmable logic device according to Patent Document 1 however has all logical elements of the same configuration though it has an effect on reduction in area of wiring between the logical elements and reduction in electric power consumption. That is, there is no consideration about improvement in the logical element per se, that is, the internal structure of the logical element. Therefore, when implementation of a certain application by use of the programmable logic device is taken into account, the logical elements still need be designed to support a circuit block requiring the highest speed even if the application is separated into two processing blocks, that is, a processing block to be processed at a high speed and a processing block to be processed at a low speed.

As a result, the logical elements designed for high speed are also used for the circuit block operating at a low speed, so that it is impossible to achieve low electric power consumption. Moreover, since all the logical elements are designed for high speed, a waste of area is formed. Thus, there is still room for improvement in reduction in area and electric power consumption of the programmable logic device.

Further, there is the following problem particularly concerned with electric power consumption.

Electric power P consumed by a semiconductor device is generally given by the following expression:

$$P = \alpha \cdot C \cdot V^2 \cdot f + I_{leak} \cdot V \quad \text{(Expression 1)}$$

($\alpha$: proportional coefficient, C: the sum of gate capacitance and wiring capacitance, f: clock frequency, $I_{leak}$: the sum of leakage currents)

The first member of the aforementioned expression (1) shows electric power consumption at the time of operation of the device, and the second member of the aforementioned expression (1) shows electric power consumption caused by the leakage current which is an electric current when the device is turned off. With the recent advance of a finer semiconductor process, electric power consumption caused by the leakage current has increased unignorably as compared with electric power consumption at the time of operation. In view of reduction in electric power consumption, reduction in leakage current is an important factor as described above. As for the programmable logic device described in Patent Document 1, however, only electric power consumption at the time of operation concerned with C in the first member of the aforementioned expression (1) is taken into consideration but electric power consumption caused by the leakage current is not taken into consideration.

In order to solve the foregoing problem, an object of the present invention is to implement a programmable logic device with a small area and low electric power consumption.

In order to solve the problem, a first invention provides a programmable logic device including an array of programmable logical elements, the programmable logic device characterized in that the logical elements include: first logical elements having a predetermined logic; and second logical elements having the same logic as the first logical elements but having an upper limit of operating speed designed to be lower than that of the first logical elements.

Moreover, a second invention is characterized in that each of the second logical elements uses transistors higher in threshold voltage compared with transistors used in each of the first logical elements.

Moreover, a third invention is characterized in that the second logical elements have a layout structure different from that of the first logical elements.

Moreover, a fourth invention is characterized in that: the first logical elements are operated by a clock signal with a first clock frequency; and the second logical elements are operated by a clock signal with a second clock frequency lower than the first clock frequency.

Moreover, a fifth invention is characterized in that the first logical elements are arranged collectively in one place.

Moreover, a sixth invention is characterized in that: the first logical elements are arranged in a center portion; and the second logical elements are arranged in a peripheral portion with respective to the region where the first logical elements are arranged.

Moreover, a seventh invention is characterized in that: the second logical elements are arranged in a center portion; and the first logical elements are arranged in a peripheral portion with respective to the region where the second logical elements are arranged.

An eighth invention provides a method of designing a programmable logic device formed from an array of programmable logical elements, the method characterized by including the steps of: designing first logical elements having a predetermined logic; and designing second logical elements having the same logic as the first logical elements but having an upper limit of operating speed designed to be lower than that of the first logical elements.

According to the first invention, an application can be implemented in such a manner that a circuit portion requiring high speed is implemented by the first logical elements while a circuit portion operating at low speed is implemented by the second logical elements. Accordingly, the application can be implemented with a small area and low electric power consumption compared with the case where all the circuit is implemented by the first logical elements supporting high speed.

According to the second invention, the threshold voltage of each of the transistors in the second logical elements in the circuit portion operating at low speed in the application to be implemented is increased, so that the leakage current can be reduced to thereby achieve further lower electric power consumption.

According to the third invention, an application can be implemented in such a manner that a circuit portion requiring high speed is implemented by the first logical elements while a circuit portion operating at low speed is implemented by the second logical elements. Accordingly, the application can be implemented with a smaller area and lower power consumption compared with the case where all the circuit is implemented by the first logical elements.

According to the fourth invention, a clock signal with a low speed clock frequency is supplied to the logical elements designed for low speed operation, so that electric power consumption caused by a high speed clock frequency can be suppressed to achieve further lower electric power consumption.

According to the fifth invention, when the circuit portion requiring high speed in the application to be implemented is implemented by the first logical elements, wires can be arranged efficiently between the first logical elements requiring high speed communication to thereby achieve reduction in area of the programmable logic device at the time of mapping.

According to the sixth invention, a circuit requiring high speed operation is collectively disposed in the center portion for an application requiring high speed processing performance, so that wires can be arranged efficiently between the logical elements. Accordingly, the application can be implemented with a small area. Particularly because the circuit portion performing high speed control is collectively disposed in the center portion for an application by which the circuit portion performing parallel processing at a low speed needs to be controlled at a high speed, mapping can be made efficiently.

According to the seventh invention, a circuit portion requiring high speed signal processing in an application requiring a high-speed external input/output is disposed near to the external input/output, so that wires can be arranged efficiently between the logical elements. Accordingly, the application can be implemented with a small area. Particularly, it is possible to efficiently map an application which requires high-speed processing because of the large quantity of data input/output from/to the outside and in which processes are independent of one another because of the high parallelism of the processes.

According to the eighth invention, it is possible to manufacture the programmable logic device according to the first invention with a small area and low electric power consumption.

BEST MODE FOR CARRYING OUT THE INVENTION

Embodiments of the present invention will be described below with reference to the drawings.

FIRST EMBODIMENT

Figure 1:
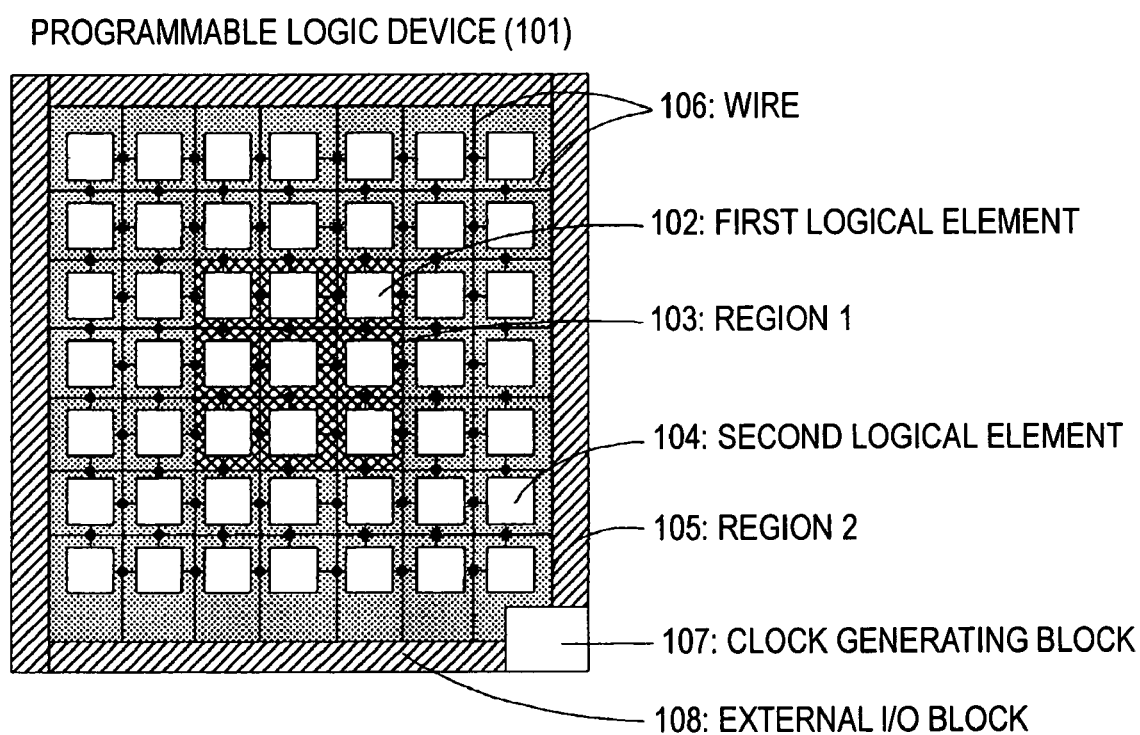
FIG. 1 is a configuration view showing a programmable logic device according to a first embodiment of the present invention.

FIG. 1 is a configuration view showing a programmable logic device according to a first embodiment. In FIG. 1, a programmable logic device 101 includes a region 1 (103), a region 2 (105), wires 106, a clock generating block 107, and an external I/O block 108. The region 1 (103) includes a plurality of first logical elements 102 arranged. The region 2 (105) includes a plurality of second logical elements 104 arranged. Although each second logical element 104 has the same logical structure and function as each first logical element 102, each second logical element 104 is formed from transistors which constitute a circuit and which are higher in threshold voltage than those of each first logical element 102.

The wires 106 are disposed horizontally and vertically between the first logical elements 102 or the second logical elements 104 so that the first logical elements 102 or the second logical elements 104 are connected to one another by the wires 106. The clock generating block 107 outputs two different frequency clocks. Though not shown in the drawing, a high frequency clock is supplied to the logical elements 102 in the first region 103 while a low frequency clock is supplied to the logical elements 104 in the second region 105. The external I/O block 108 communicates with the outside of the chip.

Figure 2:
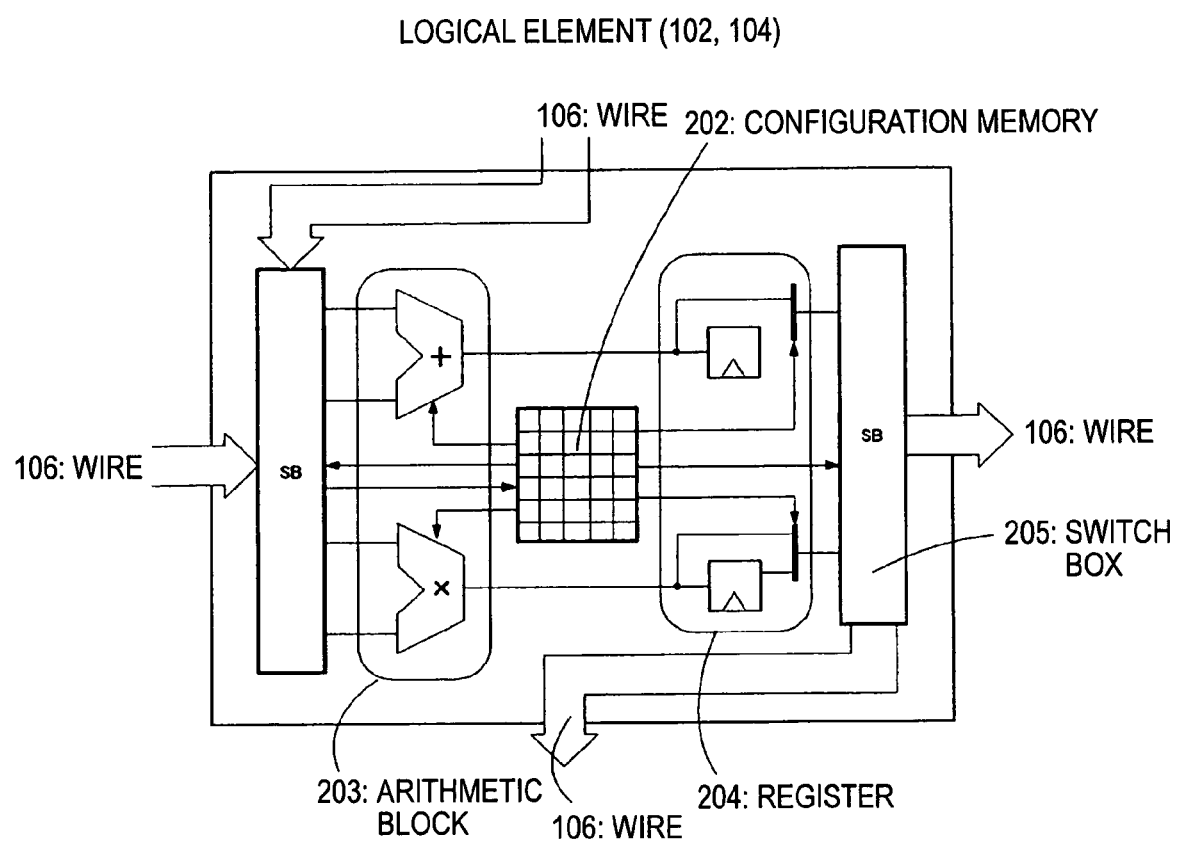
FIG. 2 is a block diagram of a logical element mounted on the programmable logic device depicted in FIG. 1.

FIG. 2 shows an internal structure of each of the first and second logical elements 102 and 104 mounted on the programmable logic device depicted in FIG. 1. The logical element 102 or 104 has a configuration memory 202, an arithmetic block 203, a plurality of registers 204, and switch boxes 205. Circuit configuration information is stored in the configuration memory 202 through the wires 106 through which adjacent logical elements are connected to each other. The arithmetic block 203 is formed from an arithmetic-logic circuit, a multiplier, etc. which can perform a plurality of arithmetic operations in accordance with a program stored in the configuration memory 202. An arithmetic result of the arithmetic block 203 in accordance with the program stored in the configuration memory 202 can be temporarily held in each of the registers 204. Each switch box 205 can connect an input of the arithmetic block 203 or an output of each register 204 to a corresponding one of the wires 106 connecting the logical elements 102 or the logical elements 104 to one another, in accordance with the program stored in the configuration memory 202.

As for the logical element 102 or 104 having the configuration shown in FIG. 2, in comparison between the first logical element 102 and the second logical element 104 depicted in FIG. 1, the operating speed of the arithmetic block in the first logical element 102 is lower than the operating speed of the arithmetic block in the second logical element 104 because the second logical element 104 uses transistors higher in threshold voltage. Since the threshold voltage of each transistor in the second logical element 104 is however higher, a leakage current which is a current at the time of switching off the transistor is so smaller that electric power consumed by the second logical element 104 is lower than electric power consumed by the first logical element 102.

The operation of this embodiment configured as described above will be described below. A digital base band process in a CDMA (Code Division Multiple Access) communication system is assumed as an example of the application implemented by the programmable logic device shown in FIG. 1. In the CDMA communication system, there are a correlated peak detection process in a synchronization portion, a finger process in a synchronous detection portion, a cell search process for controlling a finger portion, a channel codec process, etc.

In the case where the application is implemented by the programmable logic device shown in FIG. 1, the correlated peak detection process or the finger process can be distributed and parallelized because it is a process for performing a plurality of parallel processes on input data. Accordingly, the operating frequency can be made so low that the region 2 of the programmable logic device can be allocated.

On the other hand, the operating frequency in the cell search process or the channel codec process needs to be made high because the cell search process is provided as a multistage comparison and branching process based on the necessity of extracting the most suitable parameter for data processing in the finger portion or because the channel codec process needs to process input signals sequentially to make it difficult to increase parallelism. Accordingly, these processes need be implemented by use of the region 1 of the programmable logic device.

In the programmable logic device according to the present invention compared with the programmable logic device described in the reference document 1, the threshold voltage of each of the transistors in the second logical elements 104 used in the correlated peak detection process and the finger process is so high that the leakage current can be reduced to thereby reduce electric power consumption as a whole.

As described above, in accordance with this embodiment, a certain application can be implemented by the programmable logic device with low electric power consumption compared with the conventional programmable logic device including logical elements using transistors of the same threshold voltage.

SECOND EMBODIMENT

Figure 3:
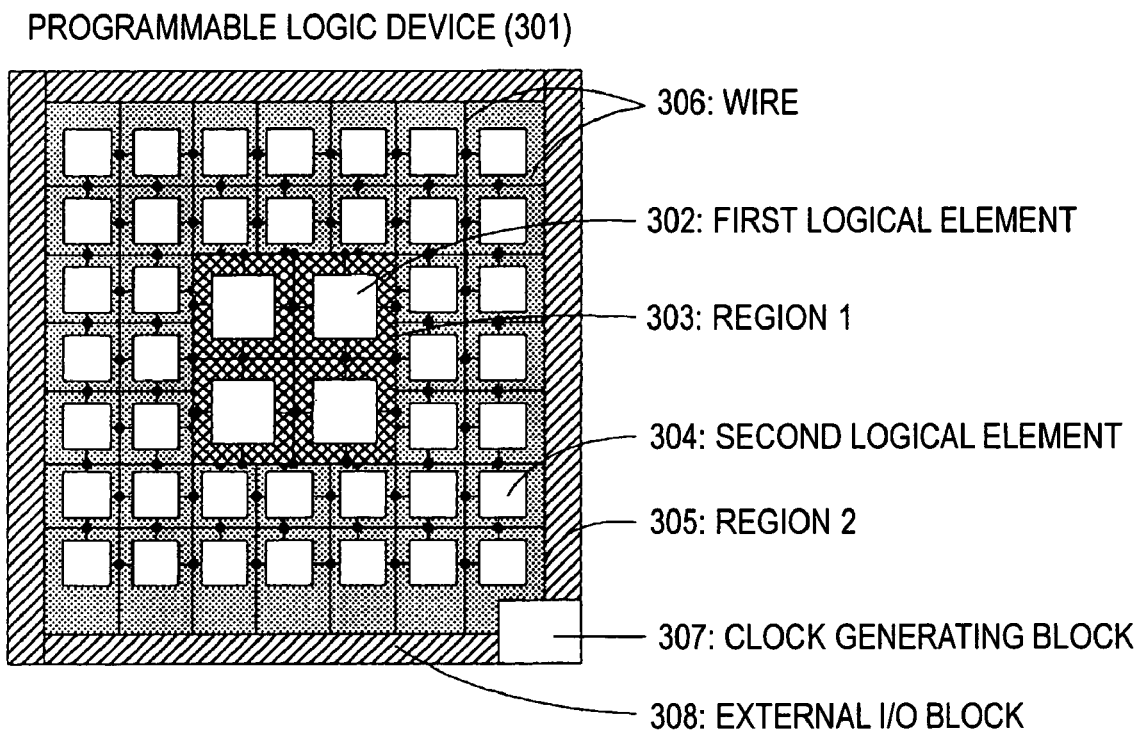
FIG. 3 is a configuration view showing a programmable logic device according to a second embodiment of the present invention.

FIG. 3 is a configuration view showing a programmable logic device according to a second embodiment. In FIG. 3, a programmable logic device 301 includes a region 1 (303), a region 2 (305), wires 306, a clock generating block 307, and an external I/O block 308. The region 1 (303) includes a plurality of first logical elements 302 arranged. The region 2 (305) includes a plurality of second logical elements 304 arranged. Although the logical structure and function of each second logical element 304 are quite the same as those of each first logical element 302, each second logical element 304 is formed from transistors which constitute a circuit and which are smaller in gate width W than each first logical element 302. The wires 306 are disposed horizontally and vertically between the first logical elements 302 or the second logical elements 304 so that the first logical elements 302 or the second logical elements 304 are connected to one another by the wires 306. The clock generating block 307 outputs two different frequency clocks. Though not shown in the drawing, a high frequency clock is supplied to the logical elements 302 of the first region 303 while a low frequency clock is supplied to the logical elements 304 of the second region 305. The external I/O block 108 communicates with the outside of the chip.

The logical structure and function of each of the first and the second logical elements 302 and 304 mounted on the programmable logic device depicted in FIG. 3 are the same as those of each of the logical elements 102 and 104 in the first embodiment.

In comparison between each first logical element 302 and each second logical element 304 in FIG. 3, the operating speed of the arithmetic block in the second logical element 304 is lower than the operating speed of the arithmetic block in the first logical element 302 because the second logical element 304 uses transistors smaller in gate width W so that the current supply capacity of each transistor is lower.

However, because the gate width W of each of the transistors in the second logical element 304 is small, capacitance parasitic on the gate is low and the wiring load on the input portion is small. Accordingly, capacitance C of the second logical element 304 according to Expression 1 can be reduced so that electric power consumed by the second logical element 304 at the time of operation can be reduced compared with the first logical element 302. Moreover, since the gate width W of each of the transistors in the second logical element 304 is small, the area of the second logical element 304 is smaller than that of the first logical element 302.

The operation of this embodiment configured as described above will be described below. Like the first embodiment, a digital base band process in a CDMA communication process is assumed as an example of the application implemented by the programmable logic device shown in FIG. 1. A correlated peak detection process and a finger process can be implemented by use of the region 2 of the programmable logic device because the operating frequency for the correlated peak detection process and the finger process can be made low. On the other hand, a cell search process and a channel codec process need be implemented by use of the region 1 of the programmable logic device because the operating frequency for the cell search process and the channel codec process needs to be high.

In the programmable logic device according to the present invention compared with the programmable logic device described in the reference document 1, gate capacitance is so low that electric power consumption at the time of operation is reduced because the gate width W of each of the transistors in the second logical elements 304 used in the correlated peak detection process or the finger process is small. Moreover, the area becomes small because the gate width W of each of the transistors in the second logical elements 304 used in the correlated peak detection process or the finger process is small.

As described above, in accordance with this embodiment, a certain application can be implemented by this programmable logic device with low electric power consumption and a small area compared with the case where the same application is implemented by the conventional programmable logic device having logic elements using transistors of the same gate width W.

In the aforementioned first and second embodiments, the region 1 operating at a high speed is disposed in the center portion of the programmable logic device. This is effective in the case where a process mapped on the region 1 controls a process mapped on the region 2 or a parameter required for the process in the region 2 is outputted. It is because the length of wiring for connecting the region 1 to the region 2 becomes short. That is, on the assumption that the aforementioned example of the CDMA communication system is used, connection to a finger process portion can be achieved at a short distance when an optimum parameter calculated by the cell search portion mapped on the region 1 is transmitted to the finger process portion mapped on the region 2.

Arrangement of the region 1 operating at a high speed in the center portion of the programmable logic device as described above is favorable for an application in which a circuit portion requiring high speed operation need perform high speed control on a circuit portion requiring low speed operation.

THIRD EMBODIMENT

Figure 4:
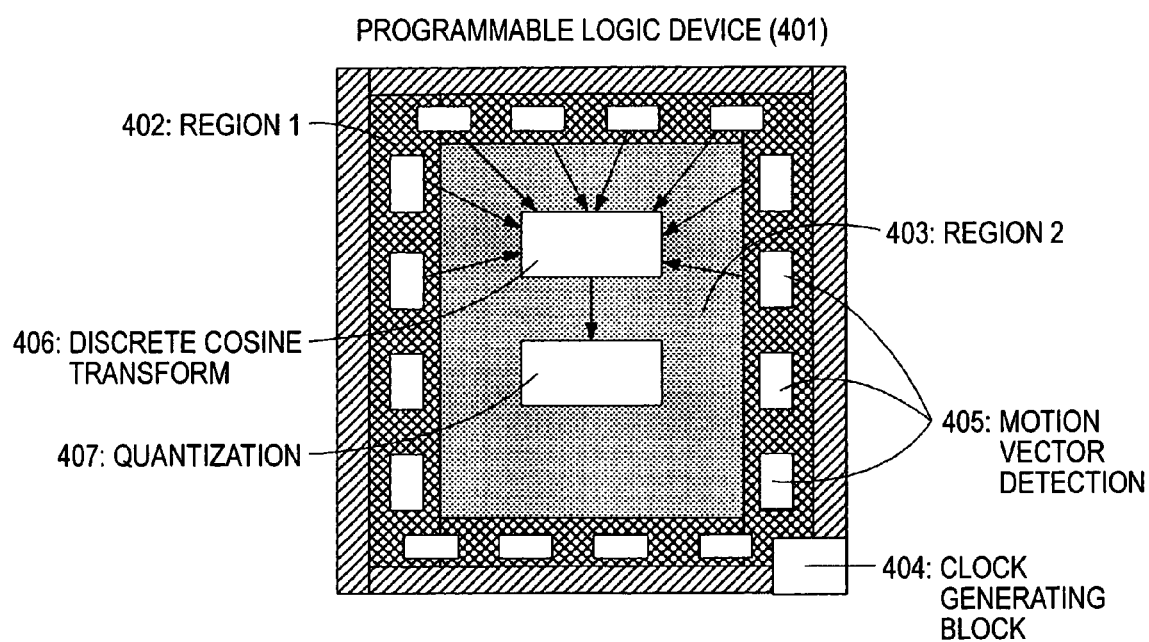
FIG. 4 is a configuration view showing a programmable logic device according to a third embodiment of the present invention.

FIG. 4 is a configuration view showing a programmable logic device according to a third embodiment. In FIG. 4, a programmable logic device 401 includes a region 1 (402), a region 2 (403), and a clock generating block 404. The region 1 (402) includes a plurality of first logical elements arranged. The region 2 (403) includes a plurality of second logical elements arranged. Although the logical structure and function of each second logical element are quite the same as those of each first logical element, the upper limit of operating speed of the second logical element is designed to be lower than that of the first logical element. The clock generating block 404 outputs two different frequency clocks. Though not shown in the drawing, a high frequency clock is supplied to the logical elements in the first region 402 while a low frequency clock is supplied to the second logical elements in the second region 403.

In FIG. 4, configuration is made so that the region 2 (403) is disposed in the center portion of the programmable logic device 401 while the region 1 (402) is disposed in the peripheral portion of the programmable logic device 401.

A process for encoding MPEG which is a moving picture compression system is assumed as an application implemented by the programmable logic device 401 depicted in FIG. 4.

The MPEG encoding process includes processes such as motion vector detection, discrete cosine transform, quantization, etc. Among these, the processing block highest in speed and largest in throughput is motion vector calculation.

Here, to discuss the motion vector detection in detail, this process is an arithmetic operation taking a correlation of a certain macro block with a plurality of macro blocks near to the macro block and requires input of a large quantity of macro block data from the outside. On the other hand, this arithmetic operation is a process for calculating the sum of absolute values of differences (SAD: Sum of Absolute Difference) from the macro block. In this arithmetic operation, parallelism of processes is so high that respective SAD arithmetic operations are independent of one another.

Accordingly, when a motion vector detection process is mapped on the region 1 (402) of the programmable logic device 401 depicted in FIG. 4 and discrete cosine transform and quantization processes are mapped on the region 2 (403) of the programmable logic device 401, data required for the motion vector detection process can be inputted at a high speed because the region 1 (402) is disposed near to the external input/output. Since processes in the motion vector detection process are independent of one another, the number of long wires for connecting logical elements inside the region 1 (402) is small. Accordingly, the motion vector detection process can be mapped on the region 1 (402) efficiently.

As described above, in accordance with this embodiment, it is possible to efficiently implement an application which requires high-speed processing because of the large quantity of data input/output from/to the outside and in which respective processes are independent of one another because of the high parallelism of the processes.

INDUSTRIAL APPLICABILITY

An application can be implemented by the programmable logic device according to the present invention in such a manner that the first logical elements are used for a circuit portion requiring high speed while the second logical elements are used for a circuit portion operating at low speed. In this manner, there is an effect that the application can be implemented with a smaller area and lower electric power consumption, compared with the case where all the circuit is implemented by the first logical elements supporting high speed. Accordingly, the programmable logic device according to the present invention is useful as a programmable logic device, etc. in which a plurality of programmable logical elements are disposed in rows and columns.

The invention claimed is:

1. A programmable logic device comprising an array of programmable logical elements, said programmable logic device characterized in that said logical elements include:
    first logical elements having a predetermined logic; and
    second logical elements having the same logic as said first logical elements but having an upper limit of operating speed of a transistor in the second logical elements designed to be lower than that of said first logical elements.

2. The programmable logic device according to claim 1, wherein each of said second logical elements uses transistors higher in threshold voltage compared with transistors used in each of said first logical elements,
    wherein the first and second logical elements are allocated based on processes of an application program.

3. The programmable logic device according to claim 1, wherein said second logical elements have a transistor size different from that of said first logical elements.

4. The programmable logic device according to claim 1,
    wherein the first logical elements are operated by a clock signal with a first clock frequency; and
    said second logical elements are operated by a clock signal with a second clock frequency lower than said first clock frequency.

5. The programmable logic device according to claim 1, wherein said first logical elements are arranged collectively in one place.

6. The programmable logic device according to claim 5, wherein said first logical elements are arranged in a center portion of said programmable logic device; and
    said second logical elements are arranged in a peripheral portion of said programmable logic device with respect to the region where said first logical elements are arranged.

7. The programmable logic device according to claim 5, wherein:
    said second logical elements are arranged in a center portion of said programmable logic device; and
    said first logical elements are arranged in a peripheral portion of said programmable logic device with respect to the region where said second logical elements are arranged.

8. A method of designing a programmable logic device formed from an array of programmable logical elements, said method characterized by comprising the steps of:
    designing first logical elements having a predetermined logic; and
    designing second logical elements having the same logic as said first logical elements but having an upper limit of operating speed of a transistor in the second logical elements designed to be lower than that of said first logical elements.

* * * * *